(12) United States Patent
Pedersen

(10) Patent No.: US 9,367,450 B1
(45) Date of Patent: Jun. 14, 2016

(54) ADDRESS ARITHMETIC ON BLOCK RAMS

(71) Applicant: Altera Corporation, San Jose, CA (US)

(72) Inventor: Bruce B. Pedersen, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 157 days.

(21) Appl. No.: 14/047,736

(22) Filed: Oct. 7, 2013

(51) Int. Cl.
*G06F 12/06* (2006.01)
*G11C 7/10* (2006.01)

(52) U.S. Cl.
CPC .............. *G06F 12/06* (2013.01); *G11C 7/1036* (2013.01)

(58) Field of Classification Search
CPC ............................... G06F 12/06; G11C 7/1036
USPC .................................... 711/154, 169, E12.001
See application file for complete search history.

(56) References Cited

U.S. PATENT DOCUMENTS

| | | | |
|---|---|---|---|
| 5,628,026 A * | 5/1997 | Baron et al. ................. 710/1 |
| 6,446,173 B1 * | 9/2002 | Pham ........................... 711/147 |
| 7,162,617 B2 * | 1/2007 | Ota ........................ G06F 9/3861 |
| | | | 712/214 |
| 7,266,661 B2 * | 9/2007 | Walmsley ..................... 711/164 |
| 2010/0005250 A1 * | 1/2010 | Simon et al. ................... 711/154 |
| 2011/0320755 A1 * | 12/2011 | Blake .................. G06F 12/0292 |
| | | | 711/170 |

FOREIGN PATENT DOCUMENTS

| | | | | |
|---|---|---|---|---|
| GB | 1477236 A | * | 6/1977 | ............... G06F 12/06 |
| GB | 201410053 | * | 7/2014 | ......... G11C 11/4082 |

* cited by examiner

*Primary Examiner* — Pierre-Michel Bataille

(57) ABSTRACT

Systems and methods are disclosed for reducing or eliminating address lines that need to be routed to multiple related embedded memory blocks. In particular, one or more inputs are added to a block Random Access Memory (RAM) such that when one or more of the inputs are asserted, the address input to the Block RAM may be incremented prior to being used to retrieve data contents of the block RAM. Thus, if address <addr> is provided to the block RAM and the address increment signal is asserted, data may be read from location <addr+N> instead of <addr>, where N may be an integer. Block RAMs with such address arithmetic may be used to implement wide First-In-First-Out (FIFO) queues, wide memories, and/or data-burst accessible block RAMs.

15 Claims, 6 Drawing Sheets

600

ADDRESS ARITHMETIC ON BLOCK RAMS

BACKGROUND OF THE DISCLOSURE

A Field Programmable Gate Array (FPGA) or logic device is an integrated circuit consisting of programmable logic blocks and programmable routing. Programmable logic blocks may include blocks of logic elements, for performing programmable logic operations, and block Random Access Memories (RAMs) for storing and retrieving data. In an illustrative example, block RAMs may contain 16,000 (16K) bits addressable in various address depth and word width configurations. For example, a 16K block RAM may be addressable in a 8x2K configuration, i.e., 8 address locations of 2,000 bits each, or a 1x16K configuration, i.e., 1 address location of 16,000 bits.

Block RAMs may receive inputs from address ports and data ports. Each block RAM may have two address ports and two data ports—one address port and one data port for reading and one address port and one data port for writing.

If wide data ports, i.e., data ports capable of processing a large number of data bits, or deeper address ports, i.e., address ports capable of processing a large number of address locations, are required, then multiple blocks RAMs may be accessed in parallel. For example, each block RAM in a group of multiple block RAMs may provide some portion of the desired data or address ports. Thus, a group of multiple block RAMs may be physically stitched together to form a virtual large block RAM. Virtual large block RAMs may be used to implement, for example, wide First-In-First-Out (FIFO) queues, wide memories, and/or data-burst accessible block RAMs.

In conventional implementations of such group block RAMs, address lines have to be routed to each block RAM in the group of block RAMs. Additional soft logic may be required to create a local address for each block RAM when implementing byte-addressable wide memories. Group block RAMs used to implement wide FIFOs would also require multiple address lines to be routed to each block RAM in the group of block RAMs. Routing address lines consumes general interconnect resources, which are limited, and the toggling of the address lines in the general interconnect adds to overall power consumption. Additionally, routing address lines often results in routing congestion causing critical timing delays in the design being implemented within an FPGA.

This disclosure relates to systems and methods for reducing or eliminating address lines that need to be routed to multiple related embedded memory blocks.

SUMMARY OF THE DISCLOSURE

To address the above and other shortcomings within the art, the present disclosure provides methods and systems for reducing or eliminating address lines that need to be routed to multiple related embedded memory blocks. This may reduce routing congestion, utilize logic and routing resources efficiently, and decrease power consumption of toggling routed address lines.

In an embodiment, one or more inputs are added to a block RAM such that when one or more of the inputs are asserted, the address input to the Block RAM may be incremented prior to being used to retrieve data contents of the block RAM. Thus, if address <addr> is provided to the block RAM and the address increment signal is asserted, data may be read from location <addr+N> instead of <addr>, where N may be an integer. The value N may be a constant, e.g., 1, or a programmable constant stored in a configuration register inside the block RAM.

In an embodiment, the address <addr> used to access the data in the block RAM may come from an internal address register inside the block RAM rather than the input pins of the block RAM.

In an embodiment, the incremented address—whether that address originated from external block RAM pins or the internal address register of the block RAM—may be written back into the internal address register.

In an embodiment, a reset input may be added to the block RAM such that the internal address register is reset to a constant when the reset input is asserted. The constant may have value either 0 or N.

In an embodiment, separate address registers may be included in the write and read ports of the block RAM.

In an embodiment, a block RAM with address arithmetic may be used to implement FIFOs that do not require any explicit read/write addresses routed to them.

In an embodiment, a block RAM with address arithmetic may be used to implement wide-output RAMs that are accessible on bit or byte boundaries that require only a single address bus to be routed to all of the stitched block RAMs.

In an embodiment, a block RAM with address arithmetic may be used to facilitate burst access to the block RAM, such that the burst access starts reading data from a given address and continues reading data forward from that address for an indeterminate number of bytes, without explicitly supplying each new address on the address ports of the block RAM.

BRIEF DESCRIPTION OF THE DRAWINGS

Further features of the disclosure, its nature and various advantages will be apparent upon consideration of the following detailed description, taken in conjunction with the accompanying drawings, in which like reference characters refer to like parts throughout, and in which.

DETAILED DESCRIPTION OF THE INVENTION

To provide an overall understanding of the invention, certain illustrative embodiments will now be described. However, it will be understood by one of ordinary skill in the art that the systems and methods described herein may be adapted and modified as is appropriate for the application being addressed and that the systems and methods described herein may be employed in other suitable applications, and that such other additions and modifications will not depart from the scope hereof.

Figure 1:
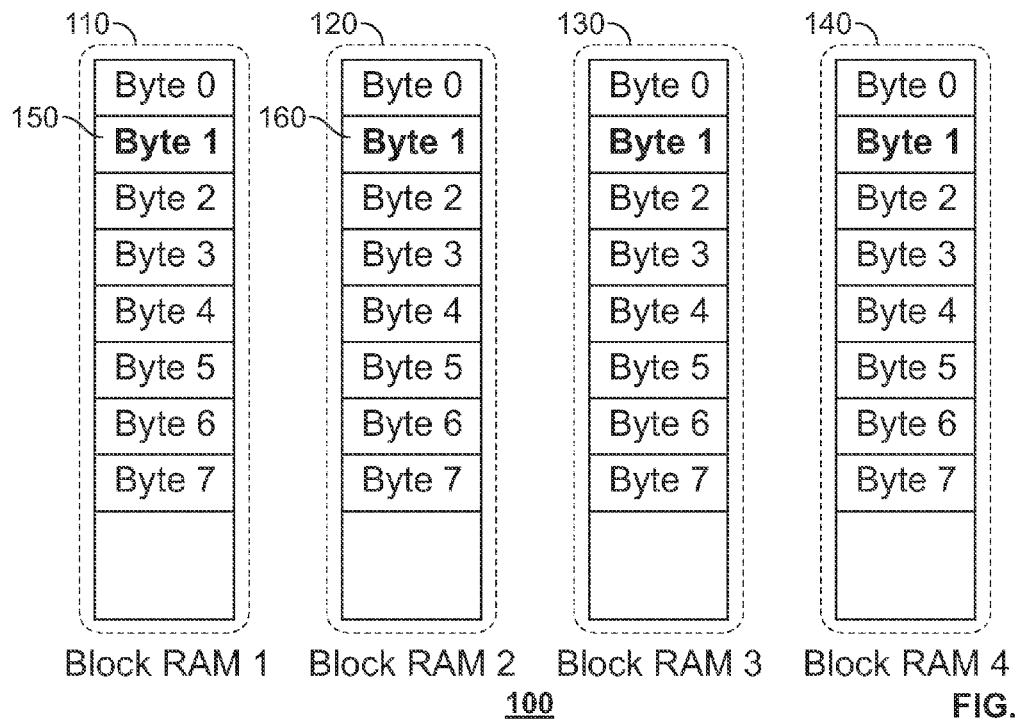
FIG. 1 is a simplified block diagram of wide memory, according to an illustrative embodiment.

FIG. 1 is a simplified block diagram of wide memory, according to an illustrative embodiment. Wide memory 100 includes block RAMs 110, 120, 130, and 140. Each block RAM may contain, for example, 16K bits addressable in various address depth and word width configurations. For example, each block RAM 110, 120, 130, and 140 may contain 8 address locations having 2K bits each.

Each block RAM in wide memory 100 may contain several addresses. For example, the hexadecimal address 0x0000 may correspond to byte 0 of block RAM 110, byte 0 of block RAM 120, byte 0 of block RAM 130, and byte 0 of block RAM 140. Address 0x0001 may correspond to byte 1 of block RAM 110, indicated by address location 150, and byte 1 of block RAM 120, indicated by address location 160. Therefore, memory locations in each individual block RAM 110, 120, 130, and 140 may be individually addressable, i.e., addresses 0x0000, 0x0001, etc. may be valid in each block RAM 110, 120, 130, and 140.

When block RAMs 110, 120, 130, and 140 are stitched together to form wide memory 100, byte 0 of block RAM 110 may correspond to address 0x0000 of wide memory 100, byte 0 of block RAM 120 may correspond to address 0x0001 of wide memory 100, byte 0 of block RAM 130 may correspond to address 0x0002 of wide memory 100, byte 0 of block RAM 140 may correspond to address 0x0003 of wide memory 100, byte 1 of block RAM 110 may correspond to address 0x0004 of wide memory 100, indicated by address location 150, and byte 1 of block RAM 120 may correspond to address 0x0004 of wide memory 100, indicated by address location 160.

If an application wishes to access a 4-byte-wide word starting at address 0x0000 of wide memory 100, then the memory controller (not shown) accesses the byte stored at address 0x0000 in block RAM 110, address 0x0001 in block RAM 120, address 0x0002 in block RAM 130, and address 0x0003 in block RAM 140. Data read from these four memory locations, in the respective block RAMs, corresponds to the 4-byte-wide word starting at address 0x0000.

The application may then request access to the next 4-byte-wide word, starting at address 0x0004 of block RAM 110. In this case, the memory controller will access byte 1 at address 0x0004 of block RAM 110, byte 1 at address 0x0005 of block RAM 120, byte 1 at address 0x0006 of block RAM 130, and byte 1 at address 0x0007 of block RAM 140 and provide the four bytes at these addresses to the application.

FIG. 1 is a simplified block diagram of wide memory 100 and more than four block RAMs may be included in wide memory 100. For example, wide memory 100 may include less than four or more than four block RAMs stitched together.

Figure 2:
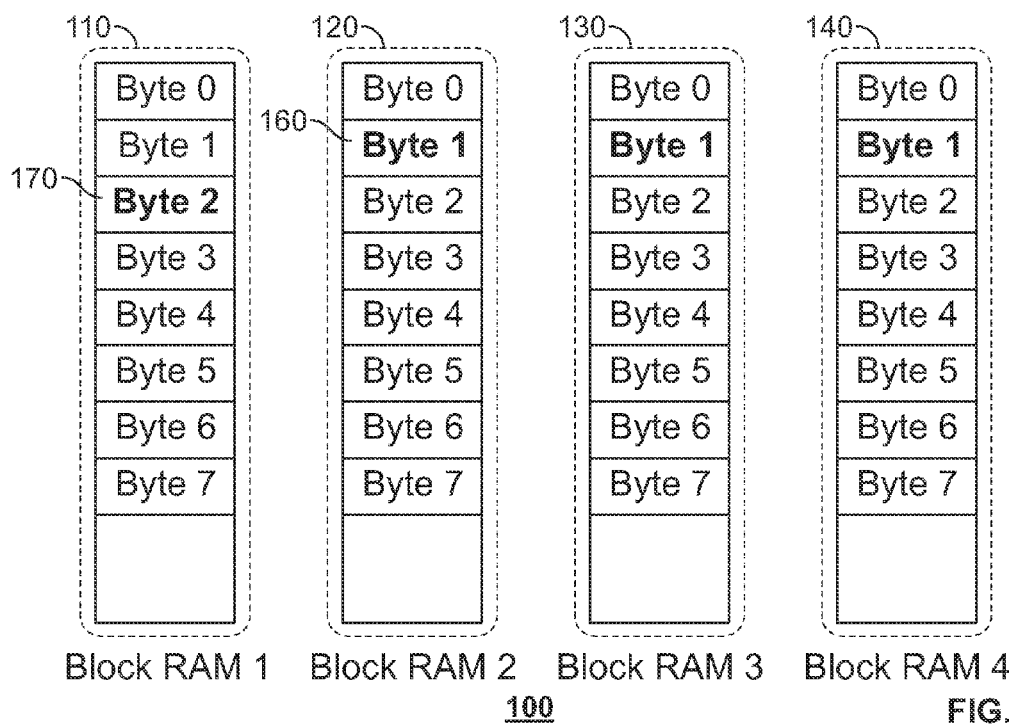
FIG. 2 is a simplified block diagram of byte-addressable wide memory, according to an illustrative embodiment.

FIG. 2 is a simplified block diagram of byte-addressable wide memory, according to an illustrative embodiment. FIG. 2 includes wide memory 100 of FIG. 1, including block RAMs 110, 120, 130 and 140. Some applications may require access to wide memory 100 at individual bit or byte locations instead of the 4-byte-wide word boundaries of wide memory 100, as shown in FIG. 1. To access wide memory 100 on individual bit or byte boundaries, a different address may need to be provided to each block RAM in wide memory 100. This is described in greater detail in connection with FIG. 3 below.

For example, consider an application that requires access to the 4-byte-wide word starting at address 0x0005 of wide memory 100, i.e., address location 160 of block RAM 120, rather than the 4-byte-wide word starting at address 0x0004, i.e., at address location 150 in block RAM 110, as described in connection with FIG. 1 above.

To access the 4-byte-wide word starting at address 0x0005 of wide memory 100, the memory controller needs to access byte 1 of block RAMs 120, 130, and 140 and byte 2 of block RAM 110. These memory locations are different than the memory locations that the memory controller accessed to get the 4-byte-wide word starting at address 0x0004 of wide memory 100 in the example described in connection with FIG. 1 above, i.e., the memory controller accessed byte 1 of each of block RAMs 110, 120, 130 and 140. In conventional implementations of wide memory, accessing block RAMs 120, 130 and 140 at address locations corresponding to byte 1 and block RAM 110 at the address location corresponding to byte 2 requires a separate address generator for each block RAM or the routing of multiple addresses to each of the stitched block RAMs.

Figure 3:
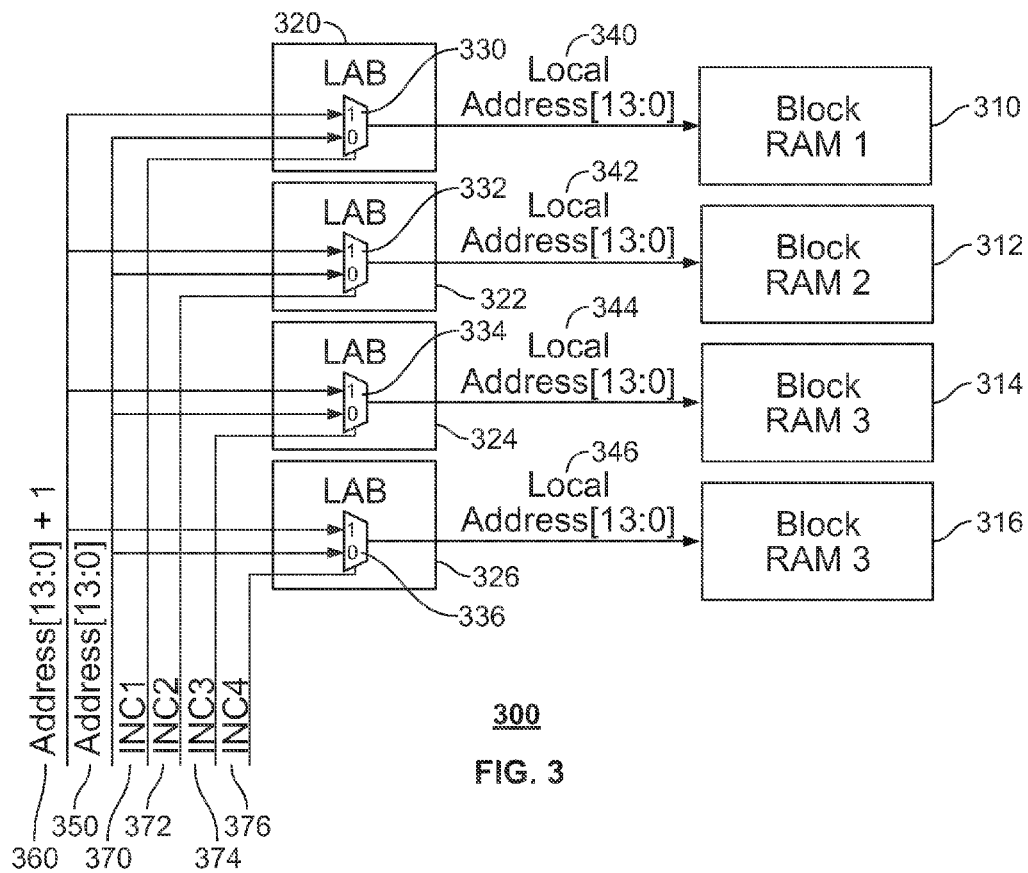
FIG. 3 is a simplified block diagram of a conventional implementation of a stitched block RAM, according to an illustrative embodiment.

FIG. 3 is a simplified block diagram of a conventional implementation of a stitched block RAM, according to an illustrative embodiment. Stitched block RAM 300 includes block RAM 310, block RAM 312, block RAM 314, and block RAM 316. Each of block RAMs 310, 312, 314, and 316 may be substantially similar to block RAMs 110, 120, 130, and 140, respectively, of FIG. 1.

Stitched block RAM 300 may include logic array blocks (LABs) 320, 322, 324, and 326. Each of LABs 320, 322, 324, and 326 may include a multiplexer. LAB 320 may include multiplexer 330, LAB 322 may include multiplexer 332, LAB 324 may include multiplexer 334, and LAB 326 may include multiplexer 336. Multiplexer 330 may be connected to block RAM 312 by local address line 340, multiplexer 332 may be connected to block RAM 312 by local address line 342, multiplexer 334 may be connected to block RAM 314 by local address line 344, and multiplexer 336 may be connected to block RAM 316 by local address line 346. Stitched block RAM 300 may include address line 360 and address line 350, each of which may be connected to multiplexers 330, 332, 334, and 336. Stitched block RAM 300 may include address increment signal lines 370, 372, 374, and 376, each of which may respectively be connected to multiplexers 330, 332, 334, and 336.

Address line 350 may provide an address to each of multiplexers 330, 332, 334, and 336. The address provided by address line 350 may correspond to a memory location in each of block RAMs 310, 312, 314, and 316 from which data may be accessed. Address line 360 may provide a second address to each of multiplexers 330, 332, 334, and 336. The address provided by address line 360 may increment the address provided by address line 350 by 1. For example, if address line 350 provides address 0x0000, then address line 360 may provide address 0x0001.

Each of address increment signal lines 370, 372, 374, and 376 may provide an increment signal which, if asserted, may cause the respective multiplexer 330, 332, 334, or 336 to select address line 360 instead of address line 350. Based on the operation of multiplexers 330, 332, 334, and 336, each respective LAB 320, 322, 324, and 326 may select an address based on the addresses provided by address line 350 or 360 and provide a local address to respective block RAMs 310, 312, 314, and 316.

For example, multiplexer 330 in LAB 320 may receive address 0x0000 on address line 350 and address 0x0001 on address line 360. Address increment signal line 370, which may be connected to multiplexer 330, may control the operation of multiplexer 330. If increment signal line 370 is asserted, then multiplexer 330 may select the address on address line 360, i.e., 0x0001, and provide it as an output on local address line 340, which is connected to block RAM 310. Thus, block RAM 310 may be accessed at address 0x0001. If increment signal line 370 is not asserted, then multiplexer 330 may select the address on address line 350, i.e., 0x0000, and provide it as an output on local address line 340, which is connected to block RAM 310. Thus, block RAM 310 may be accessed at address 0x0000. LABs 332, 334, and 336 may operate in a similar manner as LAB 320.

Continuing the example described in connection with FIG. 2 above, address line 350 may provide address 0x0001 to each of multiplexers 330, 332, 334, and 336. Address line 360 may provide address 0x0002 to each of multiplexers 330, 332, 334, and 336. As described earlier in connection with FIG. 2, each of block RAMs 312, 314, and 316 may access byte 1 at address 0x0001 and block RAM 310 may access byte 2 at address 0x0002. Accordingly, address increment signal lines 372, 374, and 376 may not be asserted, while address increment signal line 370 may be asserted. Thus, multiplexer 330 may output the address on address line 360, i.e., 0x0002, and each of multiplexers 332, 334, and 336 may output the address on address line 350, i.e., 0X0001.

Thus, FIG. 3 shows that in conventional implementations, if an application needs access to wide memory at an individual bit or byte location, each block RAM in a group of multiple stitched block RAMs requires a separate address generator.

Figure 4:
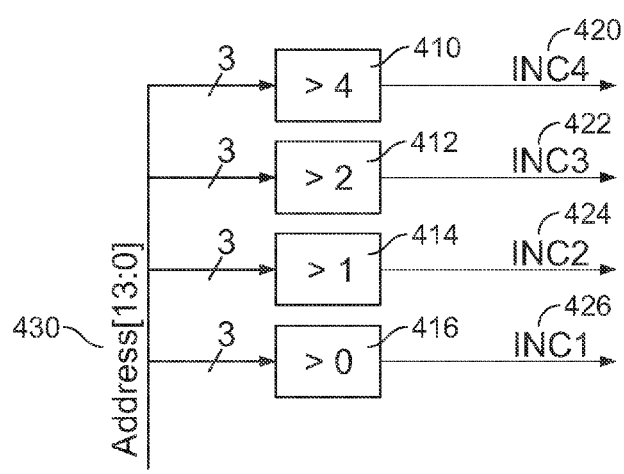
FIG. 4 is a simplified block diagram showing incremental signal logic, according to an illustrative embodiment.

FIG. 4 is a simplified block diagram showing incremental signal logic, according to an illustrative embodiment. FIG. 4 shows incremental logic which includes logic blocks 410, 412, 414, and 416, address line 430, and address increment signal lines 420, 422, 424, and 426. Address line 430 may be connected to logic blocks 410, 412, 414, and 416. Logic blocks 410, 412, 414, and 416, respectively, may output address increment signal lines 420, 422, 424, and 426. Address line 430 may be substantially similar to address line 450 of FIG. 3. Address increment signal lines 420, 422, 424, and 426 may be substantially similar to address increment signal lines 370, 372, 374, and 376, of FIG. 3.

Logic blocks 410, 412, 414, and 416 may receive an address on address line 430 and make a determination as to whether to output an asserted or not asserted address increment signal on address increment signal lines 420, 422, 424 and 426, respectively.

Figure 5:
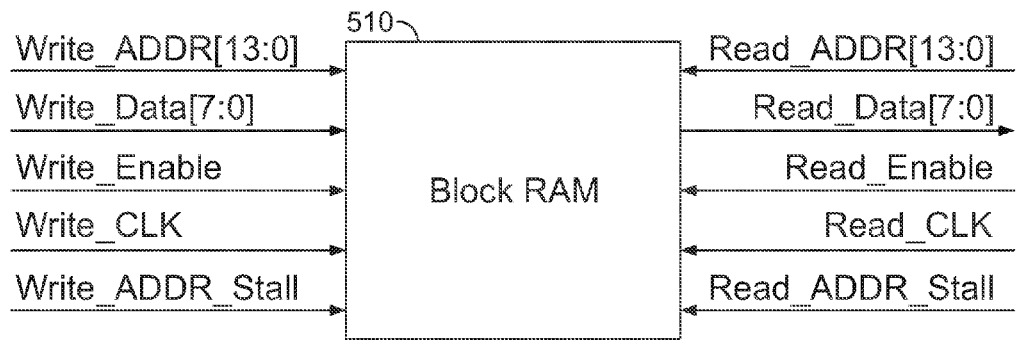
FIG. 5 is a simplified block diagram showing conventional inputs to a block RAM, according to an illustrative embodiment.

FIG. 5 is a simplified block diagram showing conventional inputs to a block RAM, according to an illustrative embodiment. Block RAM 510 may include two sets of inputs. The first set of inputs may facilitate read operations and the second set of inputs may facilitate write operations. The first set of inputs may include a read address input, a read data output, a read enable signal, a read clock signal, and a read address stall signal. The second set of inputs may include a write address input, a write data input, a write enable signal, a write clock signal, and a write address stall signal.

In an illustrative example, block RAM 510 may be a 16K block RAM. Then read data output may be 8 bits wide, so that 256, i.e., $2^8$ bits may be read from block RAM 510 at a time. Similarly, write data input may be 8 bits wide, so that 256 bits may be written to block RAM 510 at a time. Additionally, the read address input and write address input may each be 14 bits wide, so that 16K, i.e., $2^{14}$ addresses or memory locations of block RAM 510 may be accessed. The address stall signal for the read operation and the write operation is described further in connection with FIG. 6 below. Each of the block RAMs described in connection with FIGS. 1-3 above may be substantially similar to Block RAM 510.

Figure 6:
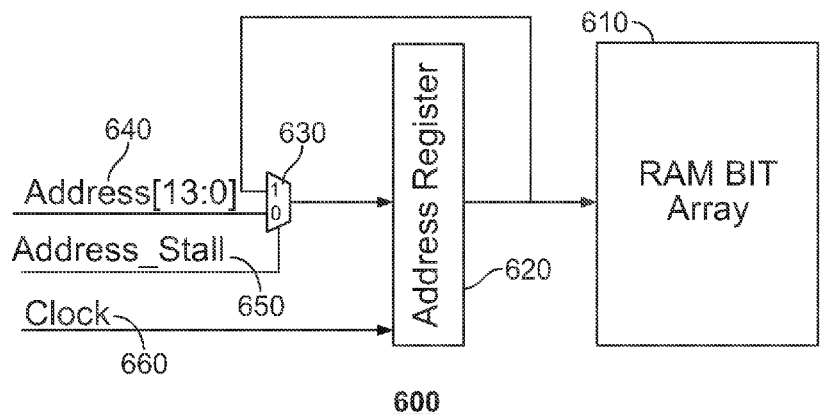
FIG. 6 is a simplified block diagram of a block RAM, according to an illustrative embodiment.

FIG. 6 is a simplified block diagram of a block RAM, according to an illustrative embodiment. Block RAM 600 may include RAM bit-array 610, address register 620, multiplexer 630, address line 640, address stall line 650, and clock signal 660. Block RAM 600 may be substantially similar to block RAM 510 of FIG. 5. Multiplexer 630 may receive as inputs address line 640, address stall line 650, and the output of address register 620. Multiplexer 630 may be connected to address register 620 and address register 620 may accordingly receive an input from multiplexer 630. Address register 620 may be connected to clock signal 660. RAM bit-array 610 may receive the output of address register 620 as input.

Address line 640 may provide an address to multiplexer 630. Address line 640 may be substantially similar to address line 350 of FIG. 3. In some embodiments, the address on address line 640 may be provided by an internal register, e.g., address register 620, inside block RAM 600. In some embodiments, the address on address line 640 may be provided by input pins (not shown) of block RAM 600.

Address stall signal 650 is a port-enable signal that may provide a control signal to multiplexer 630. When address stall signal is asserted, i.e., when address store signal 650 has a logic high value, multiplexer 630 may select as output the input it receives from address register 620. Therefore, address register 620 may retain the value already contained in address register 620 from multiplexer 630. When address stall signal 650 is not asserted, multiplexer 630 may select as output the input it receives from address line 640. Therefore, when address stall signal 650 is not asserted, address register 620 may receive as input the address on address line 640. Clock signal 660 may provide the clock for the operation of address register 620.

Figure 7:
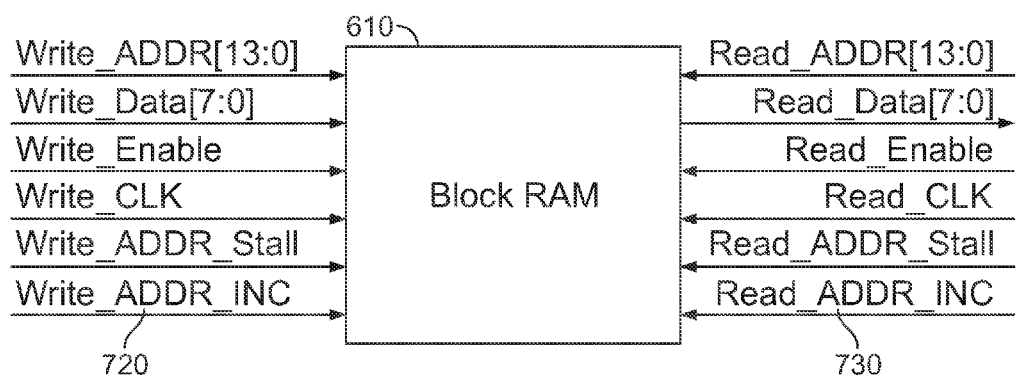
FIG. 7 is a simplified block diagram showing inputs to a block RAM, according to an illustrative embodiment.

FIG. 7 is a simplified block diagram showing inputs to a block RAM, according to an illustrative embodiment. Block RAM 610 may be substantially similar to block RAM 510 of FIG. 5. Block 610 may include two sets of inputs. The first set of inputs may facilitate read operations and the second set of inputs may facilitate write operations. The read and write inputs may be substantially similar to the read and write inputs received by block RAM 510 of FIG. 5.

In addition to the read and write inputs received by block RAM 510 of FIG. 5, block RAM 610 may receive as inputs write address increment signal 720 and read address increment signal 730. Write address increment signal 720 and read address increment signal 730 may be substantially similar, except that write address increment signal 720 is used in write operations and read address increment signal 730 is used for read operations. The operation of write address increment signal 720 and read address increment signal 730 is described in greater detail below in connection with FIG. 8.

Figure 8:
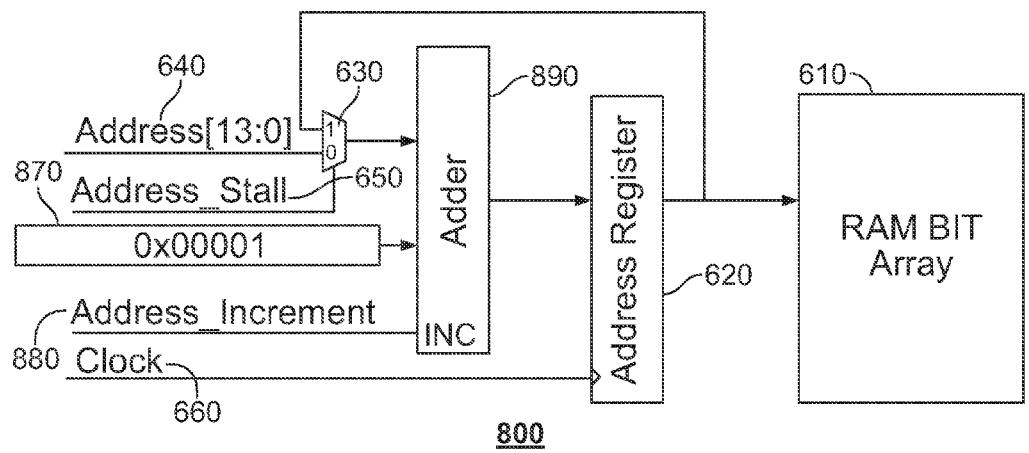
FIG. 8 is a simplified block diagram of a block RAM with address arithmetic, according to an illustrative embodiment.

FIG. 8 is a simplified block diagram of a block RAM with address arithmetic, according to an illustrative embodiment. Block RAM 800 may be substantially similar to block RAM 600 of FIG. 6. Block RAM 800 may include RAM bit-array 610, address register 620, adder 890, multiplexer 630, and register 870. Multiplexer 630 may receive address line 640 and the output of address register 620 as inputs. Multiplexer 630 may receive address stall signal 650 as a control signal.

Adder 890 may receive as inputs the output of multiplexer 630, the output of register 870, and address increment signal line 880. Address register 620 may receive as inputs the output of adder 890 and clock signal 660. RAM bit-array 610 may receive as input the output of address register 620.

Address register 620, adder 890, multiplexer 630, and register 870 may be part of the read port of block RAM 800. Block RAM 800 may contain similar circuitry in its write port (not shown).

An important distinction between block RAM 800 and block RAM 600 of FIG. 6 is the inclusion of adder 890 and register 870. Adder 890 and register 870 facilitate address arithmetic which may reduce address line routing required by conventional block RAMs. Adder 890 may receive an asserted address increment signal 880. Adder 890 may add the input it receives from multiplexer 630 to the input it receives from register 870. Register 870 may store a pre-determined value, e.g., the value 0x0001.

For example, if address line 640 provides address 0x0001 and address stall line 650 is not asserted, then multiplexer 630 may output address 0x0001, which is provided by address line 640 to adder 890. Upon receiving an asserted address increment signal 880, adder 890 may add the value it receives from register 870, i.e., 0x0001 to address 0x0001 to get address 0x0002. Adder 890 may output the value 0x0002 to address register 620. Address 0x0002 may be written to address register 620. Thus, address increment signal 880 may conditionally increment the address on address line 640 received by multiplexer 630.

In an embodiment, a block RAM with address arithmetic, such as block RAM 800, may be used to implement wide-output RAMs that are accessible on bit or byte boundaries that require only a single address bus to be routed to each of the block RAMs in a group of block RAMs stitched together.

If a block RAM with address arithmetic, e.g., block RAM 800, is used to implement a stitched block RAM, then address line 640 of each block RAM 800 in the stitched block RAM could provide the same address, e.g., 0x0001, and each block RAM 800 in the stitched block RAM could conditionally read either the data at the address provided by address line 640 or the data at the address provided by address line 640 incremented by 0x0001.

Block RAM 800 may include a reset input (not shown) that may reset address register 620 to a constant when the reset input is asserted. The constant to which address register 620 is reset may be 0x0000 or a programmable constant. The reset input may be asserted during power-up of block RAM 800 or during the operation of block RAM 800, e.g., whenever 0x0000 needs to be loaded into address register 620 without having to supply address 0x0000 on address line 640.

In an embodiment, a block RAM with address arithmetic, such as block RAM 800, may be used to implement FIFOs that do not require any explicit read/write addresses routed to them.

Figure 9:
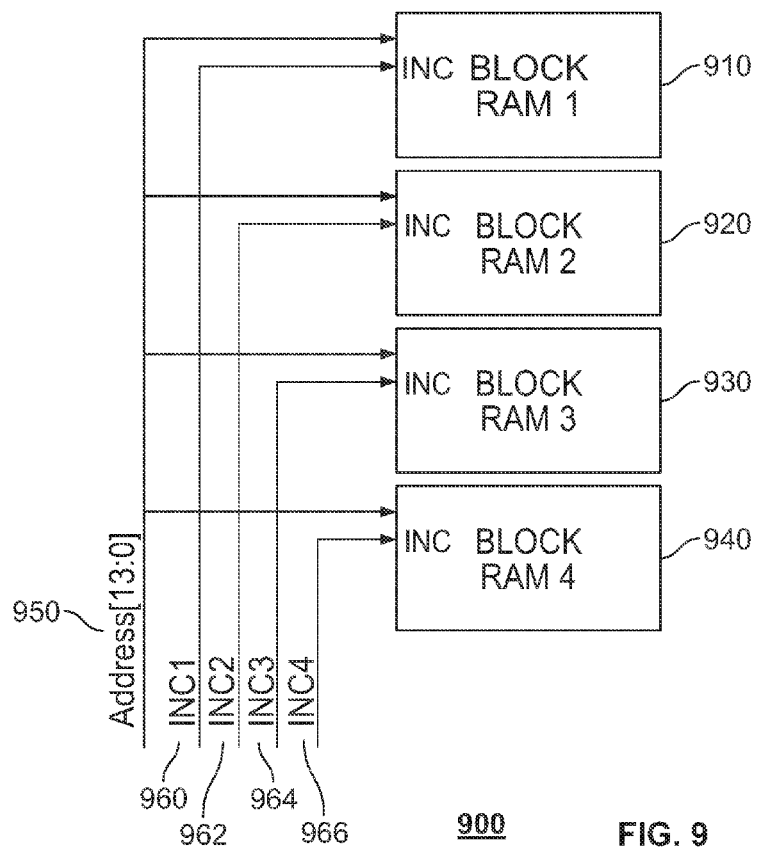
FIG. 9 is a simplified block diagram of a stitched block RAM, according to an illustrative embodiment.

FIG. 9 is a simplified block diagram of a block RAM with address arithmetic, according to an illustrative embodiment. Stitched block RAM 900 may include block RAM 910, 920, 930, and 940. Block RAMs 910, 920, 930, and 940 may be substantially similar to block RAMs 310, 312, 314, and 316 of FIG. 3. Block RAM 910, 929, 930, and 940 may receive as inputs address line 950 and address increment signal 960, 962, 964, and 966, respectively. Each of address increment signals 960, 962, 964, and 966 may be substantially similar to address increment 880 of FIG. 8.

As described in connection with FIG. 8 above, address increment signals 960, 962, 964, and 966 may be operative to conditionally increment the address received on address line 950. Conditionally incrementing the address on address 950 based on the address increment signals 960, 962, 964, and 966 is advantageous because the LABs 320, 322, 324 and 326 of FIG. 3 may no longer be necessary in stitched block RAM 900. Moreover, as shown in FIG. 9, address line 360 of FIG. 3, which may provide an incremented address to LABs 320, 322, 324, and 326 of FIG. 3 may also no longer be necessary. This may reduce routing congestion of address lines, which mitigates critical timing delays in the design being implemented within the FPGA. Additionally, reducing the number of address lines may utilize general interconnect resources more efficiently and reduce the overall power consumption.

Returning to the example described in FIG. 2, suppose that block RAMs 110, 120, 130, and 140 are substantially similar to block RAM 800 of FIG. 8. Each of block RAMs 110, 120, 130, and 140 of FIG. 2 may therefore include address arithmetic capability. If an application needs to access a 4-byte-wide word starting at an individual bit or byte boundary, e.g., say address 0x0005 of wide memory 100, which is byte 1 of block RAM 120, indicated by address location 160 of FIG. 2, then address line 640 in each of block RAMs 110, 120, 130, and 140 of FIG. 2 may provide address 0x0001, corresponding to byte 1, of the respective block RAM. Because the 4-byte-wide word starting at address 0x0005 may include data at address location byte 1 in block RAMs 120, 130, and 140, the address increment signals corresponding to block RAMs 120, 130, and 140 may not be asserted. Accordingly, address register 620 in block RAMs 120, 130, and 140 may store address 0x0001 and data will be read out from address 0x0001. However, in block RAM 110, where data needs to be accessed at byte 2, corresponding to address 0x0002, the corresponding address increment signal line may be asserted, causing adder 890 of block RAM 100 to add 0x0001 to address 0x0001 received on address line 640 by multiplexer 630. Therefore, address register 620 of block RAM 110 may store address 0x0002, which is the desired location from which data needs to be accessed.

Figure 10:
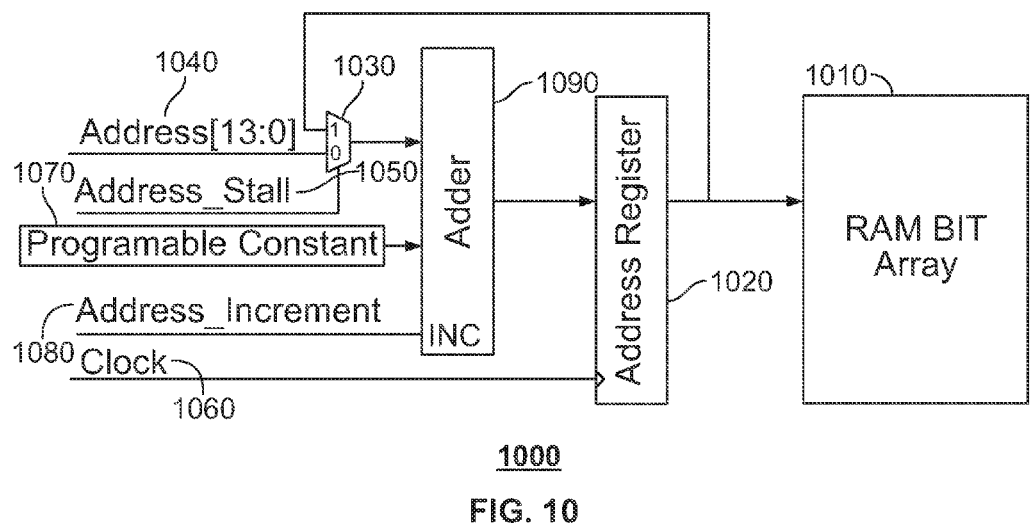
FIG. 10 is a simplified block diagram of a block RAM with address arithmetic, according to an illustrative embodiment.

FIG. 10 is a simplified block diagram of a stitched block RAM, according to an illustrative embodiment. Block RAM 1000 may include RAM bit-array 1010, address register 1020, adder 1090, multiplexer 1030, and register 1070. Multiplexer 1030 may receive address line 1040 and the output of address register 1020 as inputs. Multiplexer 1030 may receive address stall signal 1050 as a control signal. Adder 1090 may receive as inputs the output of multiplexer 1030, the output of register 1070, and address increment signal line 1080. Address register 1020 may receive as inputs the output of adder 1090 and clock signal 1060. RAM bit-array 1010 may receive as input the output of address register 1020.

RAM bit-array 1010 may be substantially similar to RAM bit-array 610 of FIG. 8, address register 1020 may be substantially similar to address register 620 of FIG. 8, adder 1090 may be substantially similar to adder 890 of FIG. 8, multiplexer 1030 may be substantially similar to multiplexer 630 of FIG. 8, address line 1040 may be substantially similar to address line 640 of FIG. 8, address stall line 1050 may be substantially similar to address stall line 650 of FIG. 8, and address increment signal line 1080 may be substantially similar to address increment signal line 880 of FIG. 8.

Block RAM 1000 may include register 1070 which stores a programmable constant instead of a pre-determined constant value of register 870 of FIG. 8. For example, register 1070 may be programmed to store value 0x000N, where N is an integer.

For example, if address line 1040 provides address 0x0001 and address stall line 1050 is not asserted, then multiplexer 1030 may output address 0x0001, which is provided by address line 1040 to adder 1090. Upon receiving an asserted address increment signal 1080, adder 1090 may add the value it receives from register 1070, i.e., 0x000N to address 0x0001. Thus, adder 1090 may output the value 0x000(N+1) to address register 1020. The value of N may be programmable by the user or may be determined automatically.

Figure 11:
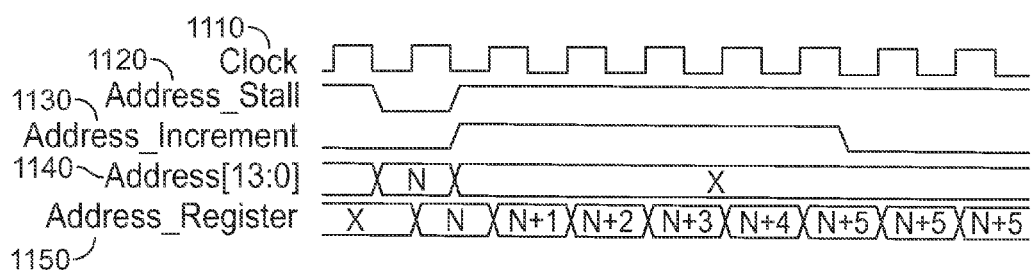
FIG. 11 is a simplified waveform diagram of a data-burst accessible block RAM, according to an illustrative embodiment.

FIG. 11 is a simplified waveform diagram of a data-burst accessible block RAM, according to an illustrative embodiment. Waveform 1110 shows a clock signal that clocks a block RAM, e.g., clock 1060 of FIG. 10, waveform 1120 shows an address stall signal, e.g. address stall signal 1050 of FIG. 10, waveform 1130 shows an address increment signal, e.g., address increment signal 1080 of FIG. 10, waveform 1140 shows an address line, e.g., address line 1040 of FIG. 10, and waveform 1140 shows an address register, e.g., address register 1020 of FIG. 10.

In an embodiment, a block RAM with address arithmetic may be used to facilitate burst access to the block RAM, such that the burst access starts reading data from a given address and continues reading data forward from that address for an indeterminate number of bytes, without explicitly supplying each new address on the address ports of the block RAM.

For example, suppose address 0x000N is provided by the address line corresponding to waveform 1140. When the address stall signal corresponding to waveform 1120 becomes logic low, address 0x000N may be loaded into the address register corresponding to waveform 1150, as described in connection with FIG. 10 above. Subsequently, when the address increment signal corresponding to waveform 1130 becomes logic high and the address stall signal corresponding to waveform 1120 also becomes logic high, address 0x000N may be incremented by 0x0001 and address 0x000(N+1) may be loaded into the address register corresponding to waveform 1150. While the address increment signal corresponding to waveform 1130 and the address stall signal corresponding to waveform 1120 remain logic high, address 0x000N may be incremented by 0x0001 at each clock cycle and the incremented address loaded into the address register corresponding to waveform 1150. This process of loading the incremented addresses into the address register corresponding to waveform 1150 may terminate when the address increment signal corresponding to waveform 1130 becomes logic low.

Figure 12:
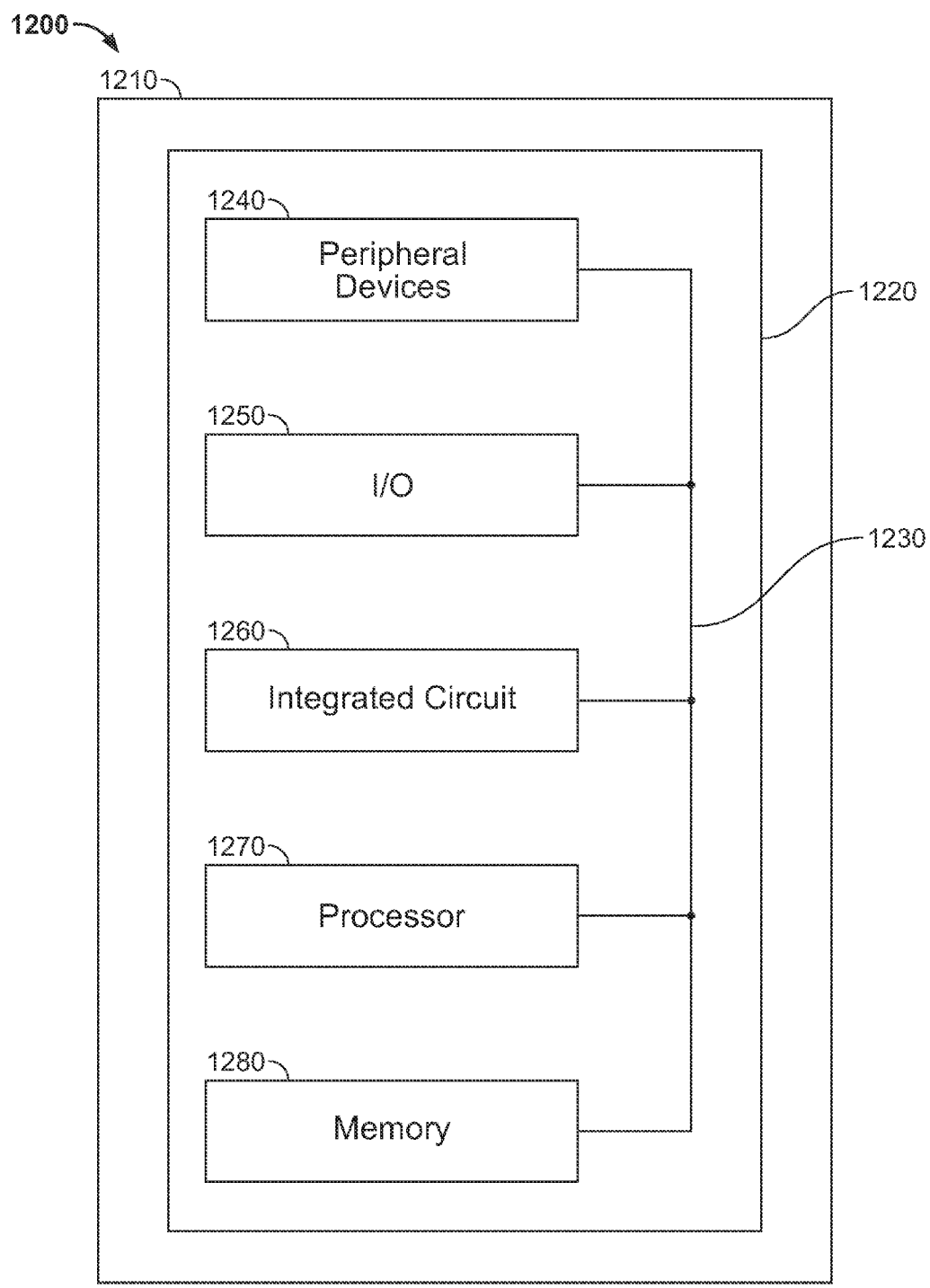
FIG. 12 illustrates a circuit or other device that includes embodiments of the circuits described herein as being within a data processing system.

FIG. 12 illustrates a circuit or other device that includes embodiments of the address routing line congestion reducing circuits described herein as being within a data processing system 1200. In an embodiment, the circuit or device may be an integrated circuit, application specific standard product (ASSP), application specific integrated circuit (ASIC), programmable logic device (PLD), full-custom chip, or dedicated chip. Data processing system 1200 can include one or more of the following components: a processor 1270, memory 1280, I/O circuitry 1280, and peripheral devices 1240. These components are connected together by a system bus or other interconnections 1230 and are populated on a circuit board 1220 which is contained in an end-user system 1210.

System 1200 could be used in a wide variety of applications, such as computer networking, data networking, instrumentation, video processing, digital signal processing, or any other application where the advantage of using programmable or reprogrammable logic is desirable. Circuit 1260 can be used to perform a variety of different logic functions. For example, circuit 1260 can be configured as a processor or controller that works in cooperation with processor 1270. Circuit 1260 may also be used as an arbiter for arbitrating access to a shared resource in system 1200. In yet another example, circuit 1260 can be configured as an interface between processor 1270 and one of the other components in system 1200. It should be noted that system 1200 is only exemplary, and that the true scope and spirit of the invention should be indicated by the following claims.

Although components in the above disclosure are described as being connected with one another, they may instead be connected to one another, possibly via other components in between them. It will be understood that the foregoing are only illustrative of the principles of the invention, and that various modifications can be made by those skilled in the art without departing from the scope and spirit of the invention. One skilled in the art will appreciate that the present invention can be practiced by other than the described embodiments, which are presented for purposes of illustration and not of limitation, and the present invention is limited only by the claims that follow.

What is claimed is:

1. A system for addressing a memory block, the system comprising:
   a register for storing a pre-determined value; and
   arithmetic circuitry for:
   receiving, from the register, the pre-determined value;
   generating a first memory address by adding the pre-determined value and a received second memory address if a received address increment signal is asserted, wherein the received address increment signal is binary valued; and
   generating the first memory address by setting the first memory address to the second memory address if the address increment signal is not asserted.

2. The system of claim 1, wherein the register is a first register and further comprising a second register for storing the generated first memory address.

3. The system of claim 2, wherein data in the memory block is retrieved based on the first memory address stored in the second register.

4. The system of claim 2 further comprising a reset pin for resetting the first memory address stored in the second register to a constant value.

5. The system of claim 1, wherein the pre-determined value is user programmable.

6. The system of claim 1, wherein the arithmetic circuitry is a first arithmetic circuitry and the address increment signal is a first address increment signal, further comprising a second arithmetic circuitry for:
   generating a third memory address based on a received second address increment signal; and
   writing data to the memory block based on the generated third memory address.

7. A system for addressing stitched memory comprising a first memory block and a second memory block, the system comprising:
   a first arithmetic circuitry for:
   receiving a first pre-determined value;
   generating a first memory address for addressing the first memory block by adding the first pre-determined value and a received second memory address if a first received address increment signal is asserted, wherein the first received address increment signal is binary valued; and
   generating the first memory address by setting the first memory address to the second memory address if the first received address increment signal is not asserted; and
   a second arithmetic circuitry for:
   receiving a second pre-determined value;

generating a third memory address for addressing the second memory block by adding the second pre-determined value and the second memory address if a second received address increment signal is asserted, wherein the second received address increment signal is binary valued; and generating the third memory address by setting the third memory address to the second memory address if the second received address increment signal is not asserted.

8. The system of claim 7, wherein the first pre-determined value is identical the second pre-determined value.

9. The system of claim 7, wherein the stitched memory is designed to implement a wide FIFO.

10. A method for addressing a memory block, the method comprising:
   storing, in a register, a pre-determined value;
   receiving, at arithmetic circuitry, the pre-determined value from the register; and
   generating, using the arithmetic circuitry, a first memory address by adding the pre-determined value and a received second memory address if a received address increment signal is asserted, wherein the received address increment signal is binary valued; and
   generating, using the arithmetic circuitry, the first memory address by setting the first memory address to the second memory address if the address increment signal is not asserted.

11. The method of claim 10, wherein the register is a first register, further comprising storing, in a second register, the generated first memory address.

12. The method of claim 11, wherein data in the memory block is retrieved based on the first memory address stored in the second register.

13. The method of claim 11 further comprising resetting, using a reset pin, the first memory address stored in the second register to a constant value.

14. The method of claim 10, wherein the pre-determined value is user programmable.

15. The method of claim 10, wherein the arithmetic circuitry is a first arithmetic circuitry and the address increment signal is a first address increment signal, further comprising:
   generating, using a second arithmetic circuitry, a third memory address based on a received second address increment signal; and
   writing data to the memory block based on the generated third memory address.

* * * * *